(12) United States Patent
Yamada et al.

(10) Patent No.: US 7,875,138 B2
(45) Date of Patent: Jan. 25, 2011

(54) ADHESIVE TAPE APPLYING APPARATUS AND TAPE SPLICING METHOD

(75) Inventors: Akira Yamada, Nara (JP); Ryouichirou Katano, Osaka (JP); Masayuki Ida, Osaka (JP); Yasuhiro Okada, Osaka (JP); Tomotaka Nishimoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/681,146

(22) PCT Filed: Oct. 3, 2008

(86) PCT No.: PCT/JP2008/002792

§ 371 (c)(1),
(2), (4) Date: Apr. 1, 2010

(87) PCT Pub. No.: WO2009/044560

PCT Pub. Date: Apr. 9, 2009

(65) Prior Publication Data

US 2010/0206458 A1    Aug. 19, 2010

(30) Foreign Application Priority Data

Oct. 3, 2007    (JP) .............................. 2007-260310

(51) Int. Cl.
*B32B 37/00* (2006.01)

(52) U.S. Cl. .................. 156/64; 156/73.4; 156/157; 156/350; 156/502; 156/580.2

(58) Field of Classification Search .................. 156/64, 156/73.1, 73.4, 157, 350, 502, 580.1, 580.2
See application file for complete search history.

(56) References Cited

U.S. PATENT DOCUMENTS 5,447,588 A * 9/1995 Merz et al. .................. 156/73.4

(Continued)

FOREIGN PATENT DOCUMENTS

JP    62-282914    12/1987

(Continued)

OTHER PUBLICATIONS

International Search Report issued Nov. 11, 2008 in International (PCT) Application No. PCT/JP2008/002792.

(Continued)

*Primary Examiner*—James Sells
(74) *Attorney, Agent, or Firm*—Wenderoth, Lind & Ponack, L.L.P.

(57) ABSTRACT

An adhesive tape applying apparatus includes a stage on which a terminal end portion of a first tape member and a leading end portion of a second tape member are placed so as to be superimposed on each other, an ultrasonic tool in which a plurality of protruding portions are provided on its contact surface that is to be put into contact with the leading end portion or terminal end portion of the superposed tape members, an ultrasonic vibration generator for applying ultrasonic vibrations in a tape's thicknesswise direction to the ultrasonic tool, and a pressing device for making a stage-directed pressing force act on the ultrasonic tool. As a result, the terminal end portion of the in-use first tape member and the leading end portion of the second tape member rolled out from a new reel can be spliced together with a simple, low-cost construction while the possibility of occurrence of trouble in tape feed is eliminated.

9 Claims, 13 Drawing Sheets

U.S. PATENT DOCUMENTS

| | | | | |
|---|---|---|---|---|
| 5,464,488 | A | * | 11/1995 | Servin ........................ 156/73.4 |
| 5,961,025 | A | * | 10/1999 | Fukumoto et al. ............ 228/5.7 |
| 6,918,232 | B2 | * | 7/2005 | Lam et al. ..................... 53/429 |
| 2007/0228207 | A1 | | 10/2007 | Ikezawa |
| 2009/0288777 | A1 | | 11/2009 | Odawara et al. |

FOREIGN PATENT DOCUMENTS

| JP | 4-243756 | 8/1992 |
|---|---|---|
| JP | 5-138739 | 6/1993 |
| JP | 2574704 | 1/1997 |
| JP | 10-147459 | 6/1998 |
| JP | 2004-196540 | 7/2004 |
| JP | 2005-297055 | 10/2005 |
| JP | 2005-327923 | 11/2005 |
| JP | 2005-336447 | 12/2005 |
| JP | 2006-096556 | 4/2006 |
| JP | 2007-186345 | 7/2007 |

OTHER PUBLICATIONS

International Preliminary Report on Patentability (Chapter II) (in English) issued Jun. 17, 2010 in corresponding International (PCT) Application No. PCT/JP2008/002792.

* cited by examiner

ADHESIVE TAPE APPLYING APPARATUS AND TAPE SPLICING METHOD

This application is a U.S. national phase application of PCT International Application PCT/JP2008/002792, filed Oct. 3, 2008.

TECHNICAL FIELD

The present invention relates to an adhesive tape applying apparatus for applying an adhesive tape dedicated to fixation of mounted components on a substrate of display panels typified by liquid crystal panels and PDPs (Plasma Display Panels). Also, the invention relates to a tape splicing method for, in such an adhesive tape applying apparatus, splicing together end portions of tape members, on which longitudinally continued adhesive tapes are applied, for addition of tape members.

BACKGROUND ART

Conventionally, as a component mounting method for mounting components onto a substrate of display panels typified by liquid crystal panels and PDPs or the like, there has been known a component mounting method including the steps of: pressing onto a substrate an ACF, which is an example of adhesive tape among ACF (Anisotropic Conductive Film) tapes as an example of tape members; thereafter separating a release tape to make an ACF layer applied to the substrate; temporarily pressure bonding, on the ACF layer, such components as TCP (Tape Carrier Package), IC and thin-type LSI package; and thereafter finally pressure bonding the components with heat and pressure applied thereto. In such a component mounting method, an ACF applying apparatus is used for applying of the ACF onto the substrate as shown above.

As the ACF applying apparatus, while an ACF tape wound on a reel is fed, only the ACF layer is cut into a specified length and then fed onto a substrate placed on a stage, and thereafter the ACF tape is pressed by a pressure bonding device so that the ACF layer cut into the specified length is applied onto the substrate. Subsequently, release tape is separated from the applied ACF layer, by which the release tape is collected, and the operation of feeding the next ACF tape is repeated.

In such an ACF applying apparatus, reel replacement, if done after a full exhaustion of the ACF tape wound on an in-use reel, would cause a need for troublesome, time-taking work of setting the ACF tape along a specified route from the beginning. In this case, it becomes necessary to splice together a terminal end portion of the in-use ACF tape and a leading end portion of ACF tape of a newly set reel. In particular, since the length of the ACF tape required for one substrate has been increasing in keeping up with recent years' increasing scales of display panels, the reel replacement needs to be done in short time even with adoption of a reel on which longer ACF tape is wound, and splicing of ACF tape with high workability is an important factor for productivity improvement.

In this connection, there is known a method in which with an end mark provided at a terminal end portion of a reel-wound ACF tape, when the end mark is detected by a sensor, an ACF tape of a new reel is spliced, at its leading end, to the terminal end portion of the in-use ACF tape. More specifically, there are known such methods as one in which while the terminal end portion of the in-use ACF tape is reversed and superposed on the leading end portion of an ACF tape of a new reel, those end portions are spliced together by heating and pressure bonding, or another in which the two tapes are spliced together with a lead tape (see, e.g., Patent Literature 1). Also known are such methods as one in which, as shown in FIGS. 16A and 16B, a release tape 102 at a terminal end portion of an in-use ACF tape 101 and a release tape 112 at a leading end portion of an ACF tape 111 of a new reel are spliced together by using another adhesive tape 121, or another method in which with double-sided adhesive tape applied to a reel or a reel-holding cassette, a terminal end portion and a leading end portion of tapes are spliced together via the double-sided adhesive tape in splicing operation.

In another known method, a splicing tape which is easy to thermally fuse and easy to detect by sensor is preparatorily spliced to both leading and terminal ends of an ACF tape. When the splicing tape at the terminal end of the in-use ACF tape is detected by a sensor, the splicing tape at the terminal end of the in-use ACF tape and a splicing tape at a leading end of an adhesive tape of a new reel are thermally fused so as to make the two tapes spliced together (see, e.g., Patent Literature 2).

In addition, in a known method, for applying of an ACF layer of an ACF tape to a substrate, instead of pressure bonding of the ACF layer by cutting the ACF layer with a cutter and heating and pressuring the ACF layer with a pressure bonding head, ultrasonic vibrations are applied to a vibrator while a vibrating surface of the vibrator is kept in pressure contact with the release tape of the ACF tape, so that the ACF layer of the ACF tape is fused by frictional heat due to the ultrasonic vibrations so as to be applied to the substrate (see, e.g., Patent Literature 3).

Furthermore, in one known method, for mounting of components onto a substrate via an anisotropic conductive film, ultrasonic vibrations in a thicknesswise direction of components are applied from above the components to fulfill the mounting of components onto the substrate (see, e.g., Patent Literature 4).

Still further, in another known method, for bonding of electric wire to joint members such as a metal plate, ultrasonic vibrations in an axial direction of the electric wire are applied to a bonding block, which is a block to be bonded, while the electric wire is pressed by the bonding block, where a contact surface of the bonding block with the electric wire is provided with a multiplicity of protruding portions for antislip use (see, e.g., Patent Literature 5).

Patent Literature 1: JP 2004-196540 A
Patent Literature 2: JP 2005-336447 A
Patent Literature 3: JP 2005-327923 A
Patent Literature 4: JP 2574704 B2
Patent Literature 5: JP 2005-297055 A

DISCLOSURE OF INVENTION

Problems to be Solved by the Invention

However, in recent years, there are many cases in which bonding of components having narrow widths at their bonding portions is involved, where the width of ACF tape to be used in such a case is as narrow as about 1 to 2 mm. As a result, in an attempt of tape bonding with a view to providing a necessary bond strength by pressuring the tapes via an ACF layer of ACF tape or an adhesive layer of adhesive tape, there would more likely occur trouble in the adhesive material or tape feed due to the adhesive material's tendency to overflow.

Also, splicing methods using an additional adhesive tape member or the like require the provision of an adhesive tape feed mechanism, incurring complicated apparatus construction, and moreover involve management of adhesive tape in addition to ACF tape, causing another problem of increases in load. Besides, methods using adhesive tape, double-sided adhesive tape or the like applied on a reel or the like have incapability of automatic splicing as well as difficulty in securing necessary splicing strength due to deterioration of the bonding surface during management of the reel or the like.

Furthermore, in methods in which splicing tapes are used and spliced together by being thermally fused as in Patent Literature 2, special ACF tape having splicing tapes applied to its both ends needs to be used, thus posing problems of higher cost and poor generality.

Patent Literature 3 discloses a constitution in which ultrasonic vibrations are applied for applying of the ACF layer of ACF tape to the substrate. Patent Literature 4 discloses a constitution in which ultrasonic vibrations are applied in the thicknesswise direction of components for bonding and mounting of the components onto the substrate via the ACF layer. Patent Literature 5 discloses a constitution in which ultrasonic vibrations are applied to a bonding block having protruding portions for bonding of electric wire to joint members such as metal plate. However, these only disclose the application of ultrasonic vibrations for bonding of an ACF layer to some other member or bonding between other members.

Accordingly, an object of the present invention, lying in solving the above-described issues, is to provide an adhesive tape applying apparatus, as well as a tape splicing method, capable of splicing together a terminal end portion of an in-use tape and a leading end portion of a tape rolled out from a new reel with a necessary splicing strength while any possibility of trouble in tape feed is eliminated, with a simple and low-cost construction.

Means to Solving the Issue

In order to achieve the above object, the present invention has the following constitutions.

According to a first aspect of the present invention, there is provided an adhesive tape applying apparatus comprising:

a tape feeding unit for feeding a tape member from a reel, the tape member having adhesive tape applied on one side of a release tape, the reel being replaceably provided in the tape feeding unit and having the tape member wound thereon;

a pressure bonding device for pressing the tape member fed from the tape feeding unit to a substrate so that the adhesive tape separated from the release tape is applied onto the substrate; and a tape splicer for splicing together a terminal end portion of an in-use first tape member and a leading end portion of a second tape member rolled out from an added reel, wherein the tape splicer comprises:

a stage on which the terminal end portion of the first tape member and the leading end portion of the second tape member are placed so as to be superimposed on each other;

an ultrasonic tool having a contact surface to be put into contact with the leading end portion or terminal end portion of the superposed tape members;

an ultrasonic vibration generator for applying ultrasonic vibrations in a tape's thicknesswise direction to the ultrasonic tool; and a pressing device for pressing the ultrasonic tool toward the stage.

According to a second aspect of the present invention, there is provided the adhesive tape applying apparatus as defined in the first aspect, wherein the ultrasonic tool has a plurality of protruding portions provided on the contact surface, and the protruding portions have a height h satisfying that h>t, relative to a thickness t of the release tape.

According to a third aspect of the present invention, there is provided the adhesive tape applying apparatus as defined in the second aspect, wherein the protruding portions of the ultrasonic tool each have a chevron-like cross-sectional shape having a top angle of 60° to 120°.

According to a fourth aspect of the present invention, there is provided the adhesive tape applying apparatus as defined in the second aspect, further comprising: a first holding part for holding the terminal end portion of the first tape member in a tensile state; and a second holding part for holding the leading end portion of the second tape member in a tensile state, wherein while the terminal end portion of the first tape member is held by the first holding part and the leading end portion of the second tape member is held by the second holding part, the terminal end portion of the first tape member and the leading end portion of the second tape member are placed so as to be superposed on the stage.

According to a fifth aspect of the present invention, there is provided the adhesive tape applying apparatus as defined in the fourth, further comprising:

a plurality of reel support plates each of which rotatably holds a reel having a tape member wound thereon and has a second holding part; and a reel positioning device which removably holds a plurality of reel support plates placed in parallel and which performs positioning of one reel support plate held by the reel positioning device to a position facing the tape splicer.

According to a sixth aspect of the present invention, there is provided the adhesive tape applying apparatus as defined in the fourth aspect, further comprising a control unit for executing:

an ultrasonic fusion-bonding process in which, in a state that the terminal end portion of the first tape member held by the first holding part and the leading end portion of the second tape member held by the second holding part are placed so as to be superposed on the stage, the pressing device is controlled so as to make the contact surface of the ultrasonic tool pressed against the superposed tape members, while the ultrasonic vibration generator is controlled so as to apply ultrasonic vibrations in a tape's thicknesswise direction to the ultrasonic tool so that the terminal end portion of the first tape member and the leading end portion of the second tape member are spliced together by ultrasonic fusion bonding; and an end edge fusion-bonding process in which, after execution of the ultrasonic fusion-bonding process, the holding of the terminal end portion of the first tape member by the first holding part is released and the tape member is moved so that at least the terminal end portion of the first tape member is positioned between the ultrasonic tool and the stage, and in which once again the pressing device is controlled so as to make the contact surface of the ultrasonic tool press against the end edge portion of the terminal end portion of the first tape member while the ultrasonic vibration generator is controlled so as to apply ultrasonic vibrations in the tape's thicknesswise direction to the ultrasonic tool so that the terminal end portion of the first tape member is spliced with the leading end portion of the second tape member by ultrasonic fusion bonding.

According to a seventh aspect of the present invention, there is provided a tape splicing method for splicing a leading end portion of an added second tape member with a terminal end portion of an in-use first tape member in an adhesive tape applying apparatus in which a tape member with an adhesive tape applied on one side of a release tape is fed from a reel having the tape member wound thereon, the fed tape member being then pressed against a substrate so that the adhesive tape separated from the release tape is applied to the substrate, the method comprising:

placing the terminal end portion of the first tape member and the leading end portion of the second tape member in superposition on each other; and pressing the contact surface of an ultrasonic tool against a superposition area of the end portions while applying ultrasonic vibrations in the tape's thicknesswise direction to the ultrasonic tool so that the terminal end portion of the first tape member and the leading end portion of the second tape member are ultrasonically fusion-bonded together.

According to an eighth aspect of the present invention, there is provided the tape splicing method as defined in the seventh aspect, wherein the ultrasonic tool used for ultrasonic fusion bonding is an ultrasonic tool in which a plurality of protruding portions are formed in its contact surface and each having a height larger than a thickness of the release tape.

According to a ninth aspect of the present invention, there is provided the tape splicing method as defined in the seventh aspect, wherein in placing the tape members in superposition on each other, the terminal end portion of the first tape member is held in a tensile state while the leading end portion of the second tape member is held in a tensile state, in which state the terminal end portion of the first tape member and the leading end portion of the second tape member are placed on the stage in superposition.

According to a tenth aspect of the present invention, there is provided the tape splicing method as defined in the ninth aspect, further comprising:

after the ultrasonic fusion-bonding of the terminal end portion of the first tape member and the leading end portion of the second tape member, releasing the holding of the terminal end portion of the first tape member;

moving the tape members so that at least the terminal end portion of the first tape member is positioned between the contact surface of the ultrasonic tool and the stage;

thereafter pressing an end edge portion the terminal end portion of the first tape member and the leading end portion of the second tape member by the contact surface of the ultrasonic tool while applying ultrasonic vibrations in the tape's thicknesswise direction to the ultrasonic tool so that the end edge portion of the terminal end portion of the first tape member is ultrasonically fusion-bonded with the leading end portion of the second tape member.

According to an eleventh aspect of the present invention, there is provided the tape splicing method as defined in the ninth aspect, wherein upon detection of the terminal end portion of the first tape member, the terminal end portion is held while the reel having the second tape member wound thereon is positioned to a position facing the stage, and the terminal end portion of the first tape member and the leading end portion of the second tape member are placed on the stage in superposition.

Effect of the Invention

According to the adhesive tape applying apparatus and the tape splicing method of the invention, in the splicing of the terminal end portion of the first tape member and the leading end portion of the second tape member, while the terminal end portion and the leading end portion of the two tape members are placed in superposition on the stage and pressed by the contact surface of the ultrasonic tool, ultrasonic vibrations in the tape's thicknesswise direction are applied thereto. Whereby, ultrasonic vibration energy can be concentratedly given to the superposed portions of the two tape members to achieve their fusion bonding. Therefore, even if the tape members are formed from a hard-to-thermally-fuse tape material or each have a narrow tape width, the splicing can reliably be achieved in a necessary splicing strength state, eliminating the need for providing any additional splicing tape at the leading end portion or terminal end portion of the tape members or for using another adhesive tape for splicing. Thus, the two tapes can be spliced together with low cost and a simple construction while the possibility of occurrence of trouble in tape feed is eliminated.

BRIEF DESCRIPTION OF DRAWINGS

These aspects and features of the present invention will become clear from the following description taken in conjunction with the preferred embodiments thereof with reference to the accompanying drawings, in which.

DESCRIPTION OF EMBODIMENTS

Figure 1:
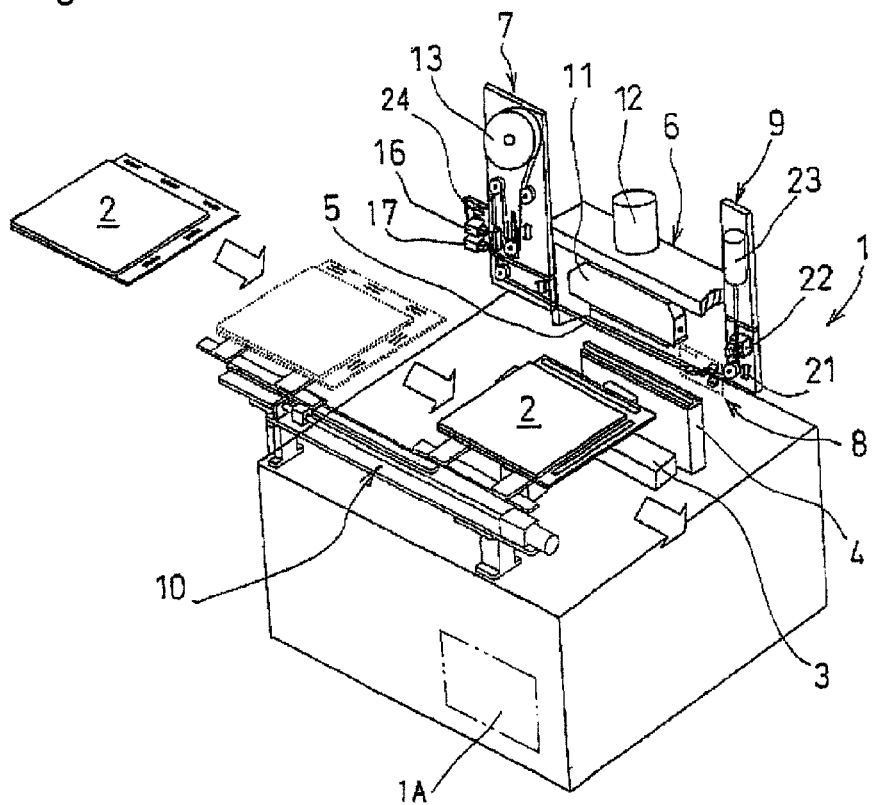
FIG. 1 is a general perspective view of an ACF applying apparatus according to a first embodiment of the present invention.

Before the description of the present invention proceeds, it is to be noted that like parts are designated by like reference numerals throughout the accompanying drawings.

Hereinbelow, the present invention will be described with reference to FIGS. 1 to 15 and FIG. 17 on embodiments in which the invention is applied to adhesive tape applying apparatuses for applying adhesive tape having an adhesive layer (ACF layer) of an anisotropic electroconductive film (ACF) onto a substrate such as a glass substrate of a liquid crystal display panel.

First Embodiment

First, an ACF applying apparatus, which is an example of an adhesive tape applying apparatus according to a first embodiment of the invention, will be described with reference to FIGS. 1, 2, 3, 4A, 4B and 4C.

Figure 2:
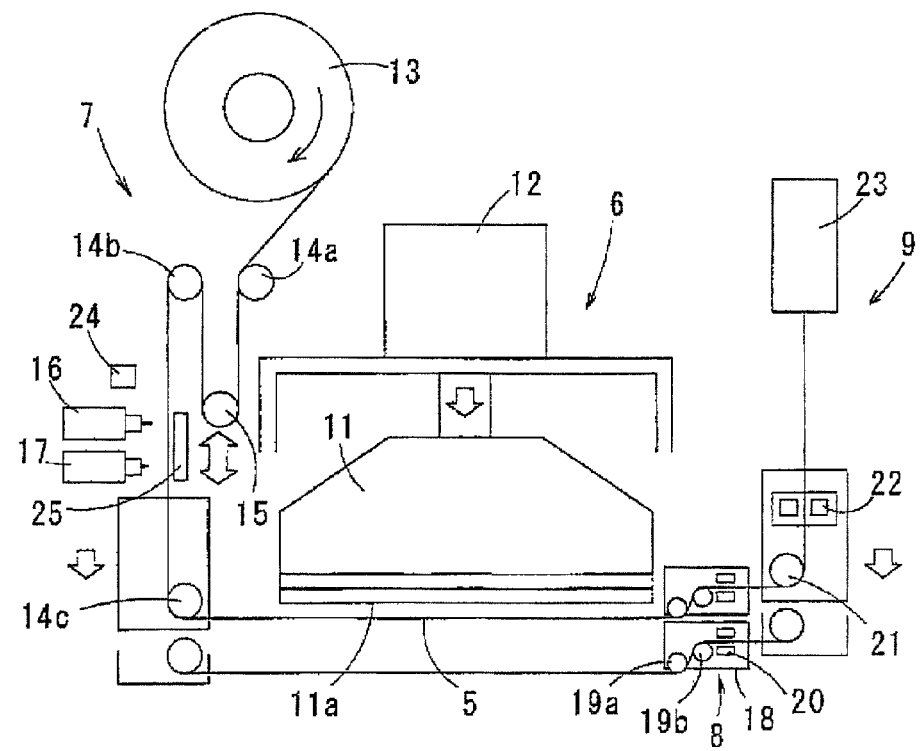
FIG. 2 is a front view showing an outlined construction of a main part of the ACF applying apparatus of the first embodiment.

Referring to FIGS. 1 and 2, the ACF applying apparatus 1 of this embodiment includes: a positioning unit 3 for supporting, moving and positioning a substrate 2; a lower-part holder 4 for supporting a side end portion of the substrate 2 from below: a pressure bonding unit 6 for pressing an ACF tape 5, which is to be bonded, from above to apply the ACF tape to the substrate 2; a tape feeding unit 7 for feeding the ACF tape 5; a separator unit 8 for separating a release tape from the ACF layer of the ACF tape 5 applied to the substrate 2; and a tape collecting unit 9 for collecting the separated release tape of the ACF tape 5. Reference sign 10 denotes a transfer unit for transferring the substrate 2, which has been carried in to a carry-in position of the ACF applying apparatus 1, onto the positioning unit 3. In FIG. 1, reference sign 1A denotes a control unit for performing operation control over the whole ACF applying apparatus 1.

As shown in FIG. 2, the pressure bonding unit 6 includes a pressure bonding head 11 which has, as its lower surface, a pressure bonding surface 11a opposed to the lower-part holder 4 placed below and which performs applying operation of the ACF tape 5, and a head up/down unit 12, such as a cylinder unit, for driving up/down move of the pressure bonding head 11. The pressure bonding head 11 has an unshown heating means, which makes it possible to heat the pressure bonding surface 11a of the pressure bonding head 11 to a specified temperature.

The tape feeding unit 7 includes: a reel 13 on which the ACF tape 5 is wound, a plurality of guide rollers 14a, 14b, 14c for guiding the ACF tape 5 fed from the reel 13; a tension roller 15 which is pressed between a pair of guide rollers 14a, 14b placed in parallel with a spacing to each other in such a manner that the tension roller 15 is movable nearer-and-farther relative to the rollers and biased for movement in a farther-going direction; a cutter 16 for making cuts-in in an ACF layer provided continuously on one side of a release tape of the ACF tape 5 so that the cuts-in are provided in steps depending on the size of an ACF layer applying area in the substrate 2; and a tape splicer 17 for splicing a terminal end portion of an ACF tape 5 and a leading end portion of another ACF tape 5 rolled out from a newly set reel 13 to each other.

The separator unit 8 is made up of: a mover 18 which is reciprocatable in its longitudinal direction between the lower-part holder 4 and the pressure bonding surface 11a of the pressure bonding head 11; a tape holding roller 19a which rolls and moves along an upper surface of the ACF tape 5 pressed to the substrate 2 along with movement of the mover 18; a tape separating roller 19b which is placed diagonally upward of the holding roller 19a and which has the release tape of the ACF tape 5 wound on part of its outer periphery and separates off the release tape along with movement of the mover 18; and a chuck 20 which is provided on the mover 18 to grip and fix the separated release tape when necessary.

The tape collecting unit 9 is made up of: a guide roller 21 for guiding the separated release tape upward; a chuck 22 for gripping and fixing the release tape; and a collecting unit 23 for sucking and collecting the release tape.

In the tape feeding unit 7 of the ACF applying apparatus 1 constructed as described above, the cutter 16 is placed upward of the tape splicer 17, while a terminal-end detection sensor 24 for detecting a terminal end portion of an in-use ACF tape 5 is placed upward thereof. Also, a stage 25 is provided in opposition to the cutter 16 and the tape splicer 17 with the ACF tape 5 interposed therebetween so that the stage 25 supports the ACF tape 5 from its rear face side when the ACF layer of the ACF tape 5 or the release tape of the ACF tape 5 is cut by the cutter 16 and when tapes are spliced together by the tape splicer 17.

As shown in FIG. 3 and FIGS. 4A to 4C, the tape splicer 17 of this embodiment, a terminal end portion 5E of an in-use first ACF tape 5a and a leading end portion 5S of a second ACF tape 5b rolled out from a newly fed reel 13 are so set as to be superposed on the stage 25. Then, a forward end surface (contact surface) 26a of an ultrasonic tool 26 is put into contact with the leading end portion 5S or the terminal end portion 5E of those ACF tapes 5, in which state ultrasonic vibrations 28 in the tape's thicknesswise direction are applied to the ultrasonic tool 26 by an ultrasonic vibration generator 27 while a pressing force 29 is exerted on the ultrasonic vibration generator 27 for action toward the stage 25 by a pressing device (not shown) as indicated by an arrow in the figure.

Figure 4A:
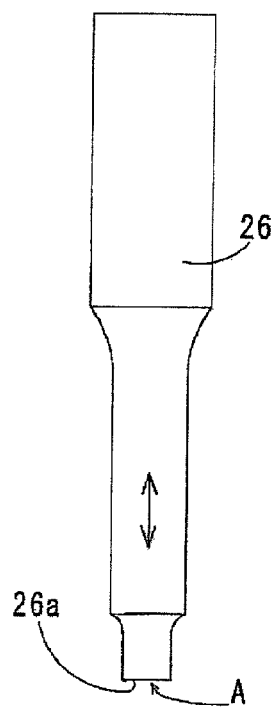
FIG. 4A is a front view of an ultrasonic tool of the tape splicing apparatus of the first embodiment.
Figure 4B:
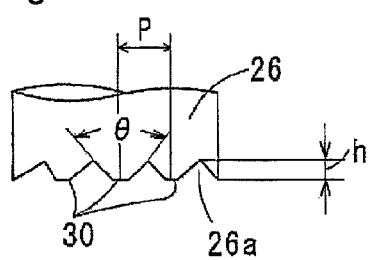
FIG. 4B is an enlarged view of a portion A of the ultrasonic tool of FIG. 4A.
Figure 4C:
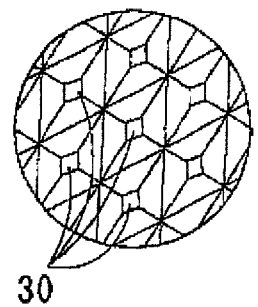
FIG. 4C is a lower face view of the ultrasonic tool of FIG. 4A.

As shown in FIGS. 4B and 4C, the ultrasonic tool 26 has a plurality of protruding portions 30 protrusively provided on the forward end surface 26a. A height h of the protruding portions 30 is so set, for example, as to satisfy that h>t, preferably h>2t, where t is the thickness of the ACF tape 5, more specifically, the thickness of the release tape. Also, preferably, the protruding portions 30 are formed each into a chevron-like cross-sectional shape having an acutest angle of 60° to 120° at the top.

Next described is the process for applying the ACF tape 5 to a side edge portion of the substrate 2 by the ACF applying apparatus 1 constructed as described above. From the state of FIGS. 1 and 2, the side edge portion of the substrate 2 is positioned onto the lower-part holder 4 by the positioning unit 3, in which state the pressure bonding head 11 is moved down by the head up/down unit 12 and the ACF tape 5 is pressed by the pressure bonding surface 11a that is the lower surface of the pressure bonding head 11, by which the ACF tape 5 is pressure bonded to the substrate 2. Next, the chuck 22 of the tape collecting unit 9 is closed so that the release tape of the ACF tape 5 is fixedly held, and the chuck 20 of the separator unit 8 is opened, in which state the mover 18 is moved toward the tape feeding unit 7 so as to make the release tape separated from the ACF layer of the ACF tape 5 applied to the substrate 2.

Next, the chuck 20 of the separator unit 8 is closed while the chuck 22 of the tape collecting unit 9 is opened so as to allow the release tape to be freely sucked and collected to the collecting unit 23. Then, the mover 18 of the separator unit 8 is moved by a specified tape feed extent. As a result, the ACF tape 5 having the ACF layer therein is fed to between the pressure bonding surface 11a of the pressure bonding head 11 and an area for applying of the ACF tape 5 in the substrate 2 positioned on the lower-part holder 4. The tension roller 15 having been moved up in correspondence to the tape feed extent, the reel 13 is then turned so that the ACF tape 5 wound on the reel 13 is fed until the tension roller 15 is positioned to the origin position.

Through and over repetition of the applying operation for the ACF tape 5 shown above, a terminal end of the ACF tape 5 wound on the reel 13 is detected by the terminal-end detection sensor 24. Upon detection of the terminal end, the reel 13 is replaced with a new reel 13, which is set to the tape feeding unit 7. Then, the terminal end portion 5E of the in-use ACF tape 5 and the leading end portion 5S of the ACF tape 5 of the new reel 13 are spliced together by the tape splicer 17, thus making it practicable to continuously feed the ACF tape 5.

Figure 3:
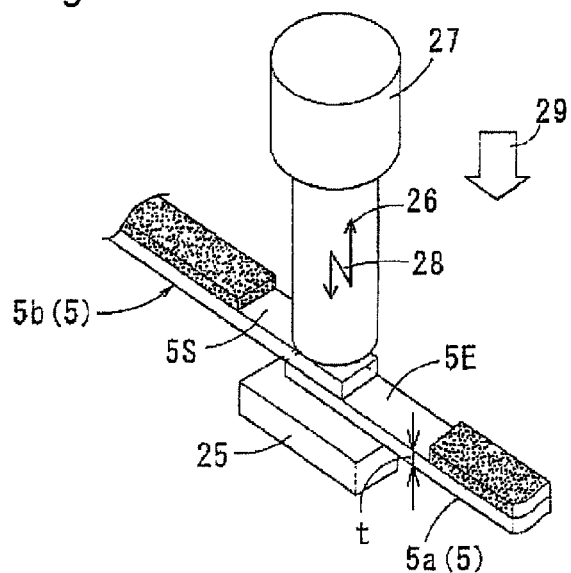
FIG. 3 is a perspective view showing a splicing state by a tape splicing apparatus of the first embodiment.
Figure 12A:
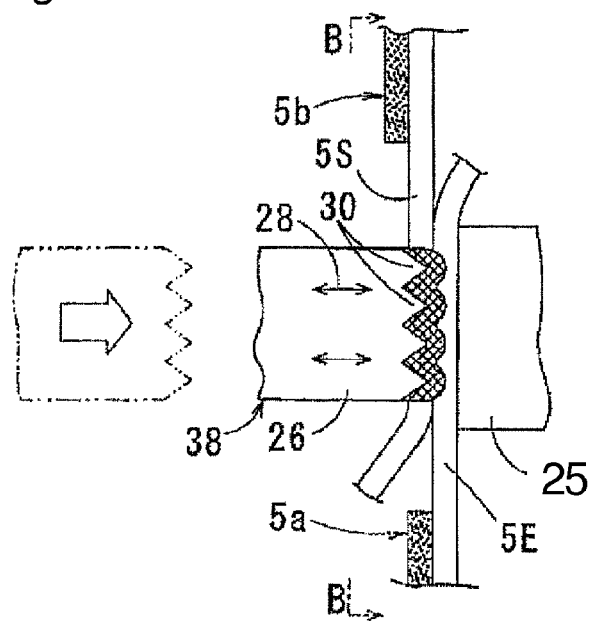
FIG. 12A is a sectional view showing in detail the tape splicing state in the second embodiment.
Figure 12B:
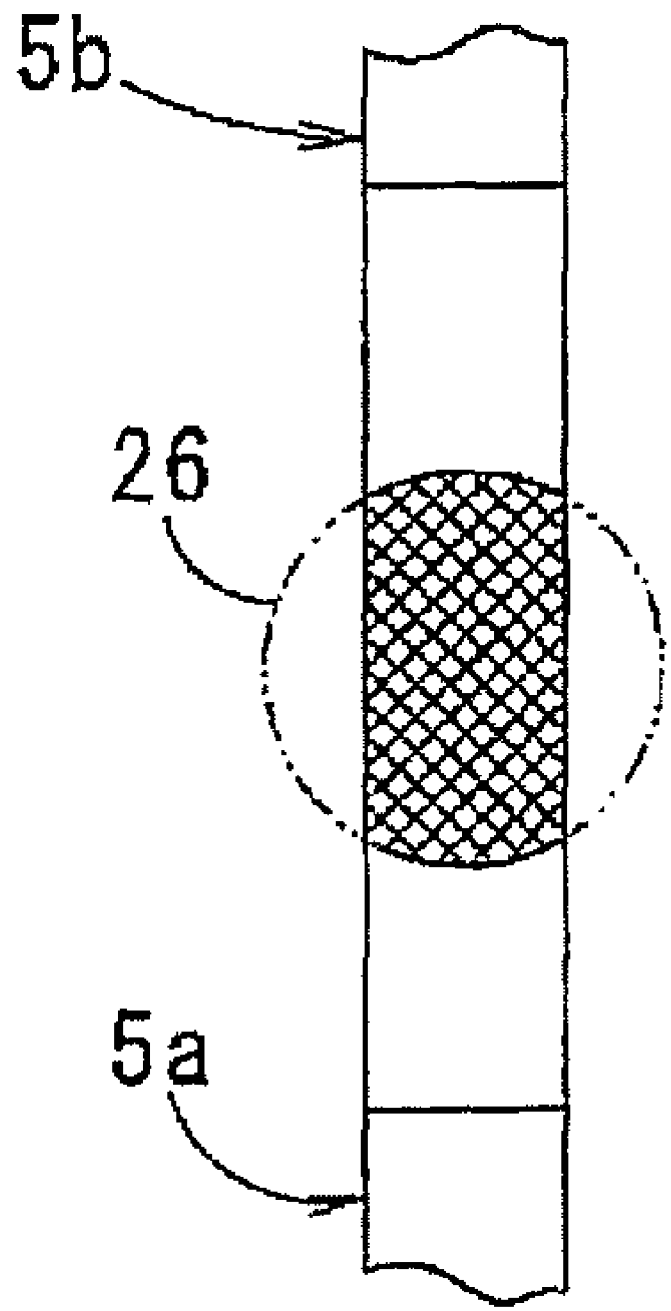
FIG. 12B is a view taken along the line B-B of FIG. 12A.

For splicing by the tape splicer 17, when the terminal end portion 5E of the in-use ACF tape 5 (first tape member) by the tape feeding unit 7 and the leading end portion 5S of the ACF tape 5 (second tape member) rolled out from the newly set reel 13 are spliced together, the terminal end portion 5E and the leading end portion 5S of the two tapes are placed so as to be superposed on the stage 25 as shown in FIG. 3. In such a state under action of the pressing force 29 in the tape's thicknesswise direction, ultrasonic vibrations 28 in the tape's thicknesswise direction are applied by using the ultrasonic tool 26 having the plurality of protruding portions 30 provided on the forward end surface 26a as shown in FIGS. 4A to 4C, so that ultrasonic vibration energy is concentratedly given to peripheries of the protruding portions 30 under the state that a plurality of protruding portions 30 are bitten into the two tapes in the tape's thicknesswise direction. As a result, as shown in FIGS. 12A and 12B, the terminal end portion 5E of the ACF tape 5a and the leading end portion 5S of the ACF tape 5b are joined together by ultrasonic fusion. Thus, since a bonding method not by thermal fusion but by ultrasonic fusion is applied, the splicing can reliably be achieved in a necessary splicing strength even if the release tape of the ACF tape 5 is made from a hard-to-thermally-fuse tape material such as polyethylene terephthalate (PET), drawn polypropylene (PP) and polytetrafluoroethylene (PTFE) or even if the ACF tape 5 has a narrow tape width.

In this case, when the height h of the protruding portion 30 of the ultrasonic tool 26 is so set relative to the thickness t of the ACF tape 5 (thickness t of the release tape in the case where release tape of the ACF tapes 5 are spliced together) as to satisfy that h>t, preferably h>2t, energy by ultrasonic vibrations can effectively be applied to the interface of tape splicing, so that the above-described functional effect can be obtained more reliably. As a result, the terminal end portion 5E and the leading end portion 5S of the ACF tapes 5 can be spliced together stably with a necessary splicing strength. Further, when the protruding portions 30 of the ultrasonic tool 26 are formed each into a chevron-like cross-sectional shape having an acutest angle of 60° to 120° at the top, the necessary splicing strength can be ensured stably without causing occurrence of holes due to an excessively small top angle or deficiency of biting due to an excessively large top angle.

According to this embodiment, since the tape splicing is done by applying ultrasonic vibrations in the tape's thicknesswise direction by using the ultrasonic tool 26 having the plurality of protruding portions 30 provided on the forward end surface, the splicing can be achieved with a necessary strength without providing another splicing tape at the leading end portion 5S or terminal end portion 5E of the ACF tape 5 and without using another adhesive tape for the splicing. Therefore, the splicing can be achieved at low cost and with a simple construction in a state that there is no possibility of occurrence of trouble in tape feed.

In a concrete example, the ACF tape 5 is so formed that a release tape formed of a PET film having a width of 1 to 3 mm and a thickness of 20 to 100 μm (50 to 100 μm for general use) is overlaid with 10 to 30 μm thick ACF as an ACF layer, where the terminal end portion 5E and the leading end portion 5S to be spliced together have the ACF removed therefrom. The ultrasonic tool 26, having a diameter of 3 mm of its forward end portion, is so constructed that protruding portions 30 each having a height h of 0.3 mm and a top angle θ of 90° are arrayed in a matrix form at a pitch P of 0.8 mm. The ultrasonic vibration generator 27 used in this case has a frequency of 60 kHz, an output power of 60 W, a pressing force 28 of 10 to 15N and a pressing time duration of 0.5 sec for ultrasonic splicing. As a result, a proper splicing state having a necessary splicing strength of about 2N or more and having no possibility of occurrence of trouble in tape feed was able to be obtained reliably and stably.

Second Embodiment

Next, an adhesive tape applying apparatus according to a second embodiment of the invention will be described with reference to FIGS. 5 to 13. It is noted that the same component members as in the foregoing first embodiment are designated by the same reference signs with their description omitted and their differences will mainly be described below.

This embodiment, differing from the first embodiment mainly in the constitution of the tape feeding unit 7 and the tape collecting unit 9, is so designed that the terminal end portion 5E of the first ACF tape 5a and the leading end portion 5S of the second ACF tape 5b are automatically spliced together so as to allow the ACF tape 5 to be continuously fed.

Figure 5:
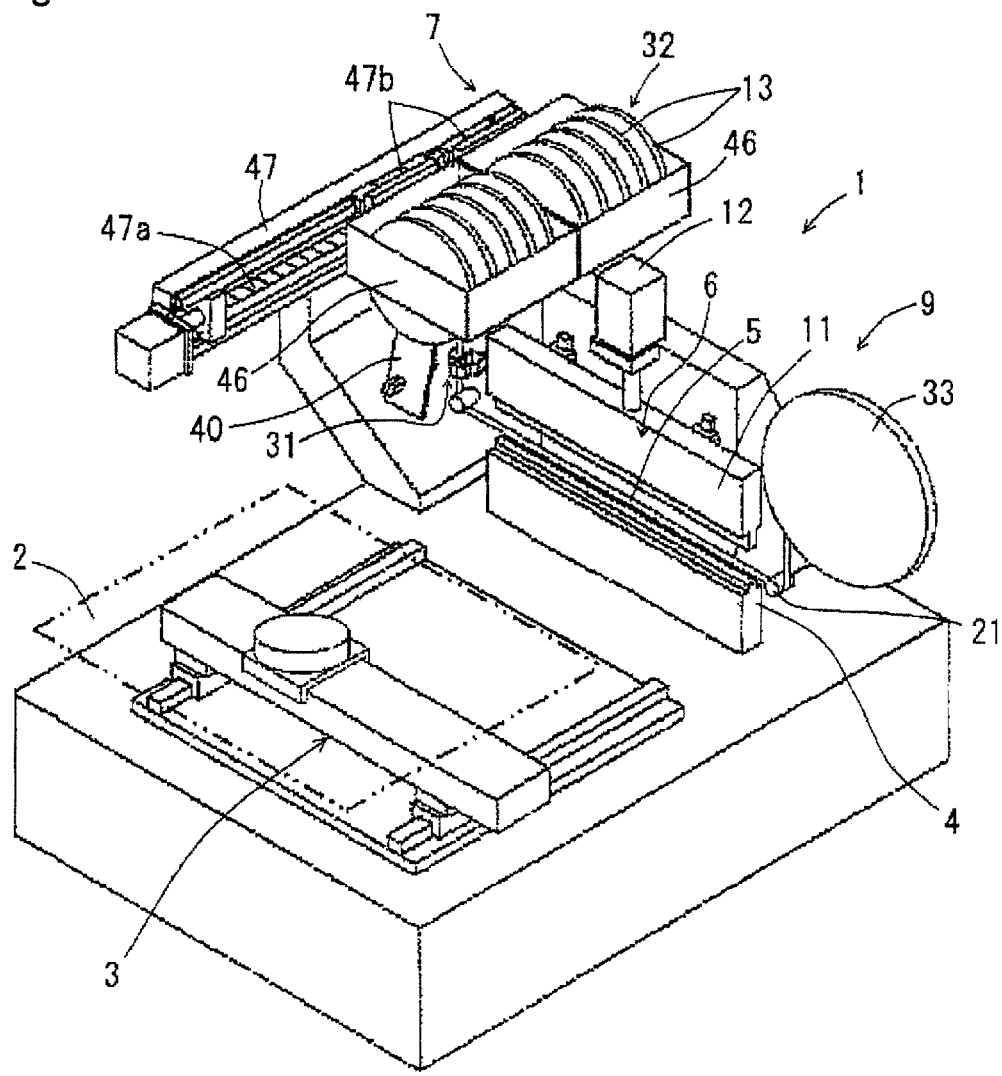
FIG. 5 is a general perspective view of an ACF applying apparatus according to a second embodiment of the invention.

Referring to FIG. 5, the tape feeding unit 7 is provided with a tape splicer 31 for splicing the terminal end portion 5E of the first ACF tape 5a and the leading end portion 5S of the second ACF tape 5b together, and a reel feeder 32 for feeding the reel 13 one after another. The tape collecting unit 9 is provided with a winder 33 for winding the release tape of the ACF tape 5 separated from the applied ACF layer and feeding the ACF tape 5 by a specified extent. In addition, the winder 33 may be provided in a construction similar to that of the tape collecting unit 9 shown in FIGS. 1 and 2.

Figure 6:
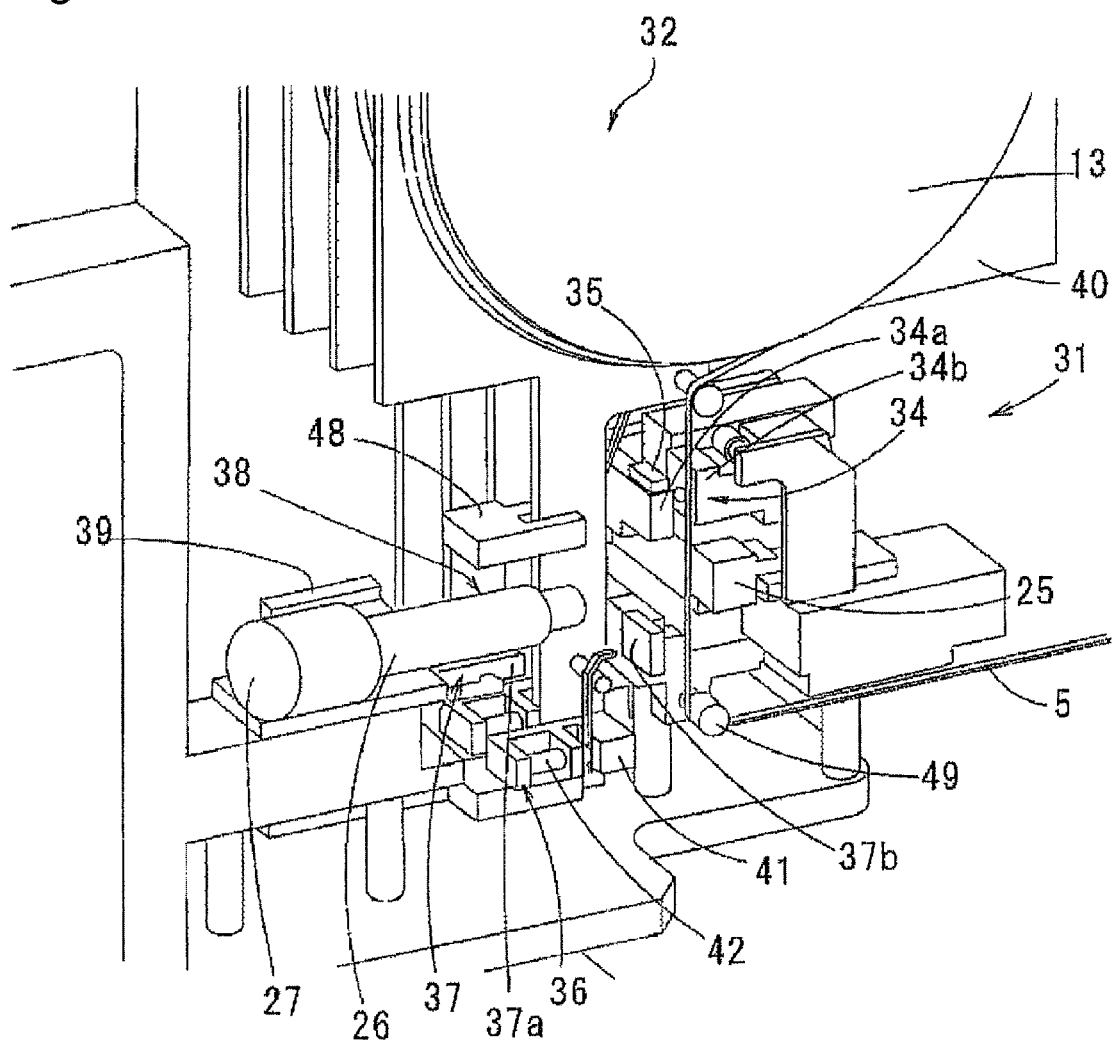
FIG. 6 is a perspective view of a tape splicing apparatus and a reel feed part in the second embodiment.

As shown in FIG. 6, the tape splicer 31 includes a first holding part 34, a first cutting part 35, a second holding part 36, a second cutting part 37, and an ultrasonic splicer 38. The ultrasonic splicer 38, which is placed between the first holding part 34 and the second cutting part 37, includes a stage 25, an ultrasonic vibration generator 27 with an ultrasonic tool 26 fitted thereon, and a presser 39 for moving the ultrasonic vibration generator 27 toward the stage 25 so that a specified pressing force acts thereon. In FIG. 6, reference sign 49 denotes a guide roller for guiding the ACF tape 5 to the pressure bonding unit 6.

The first holding part 34, which is designed to nip and hold the terminal end of the ACF tape 5 that has almost come to an end of use, has a pair of holding members 34a, 34b, which can be operated so as to go nearer to and farther from each other. The first cutting part 35, which is placed above the holding member 34a, is so designed as to cut the ACF tape 5 against the holding member 34b while nipping the ACF tape 5.

The second holding part 36, which is placed under a reel support plate 40 that rotatably holds the reel 13 on which the ACF tape 5 is wound, is so designed that the leading end of the ACF tape 5 rolled out from the reel 13 is nipped between the holding base 41 and a cylinder unit 42 fitted to the holding base 41. The second cutting part 37 includes an edge portion 37a provided on the presser 39 and a receiving portion 37b.

The second cutting part 37 is so designed that while or after the terminal end portion 5E of an in-use ACF tape 5 and the leading end portion 5S of an ACF tape 5 rolled out from a new reel 13 are spliced together by the ultrasonic splicer 38, one side of the ACF tapes closer to the second holding part 36 from their splicing parts are cut by the second cutting part 37.

Figure 7:
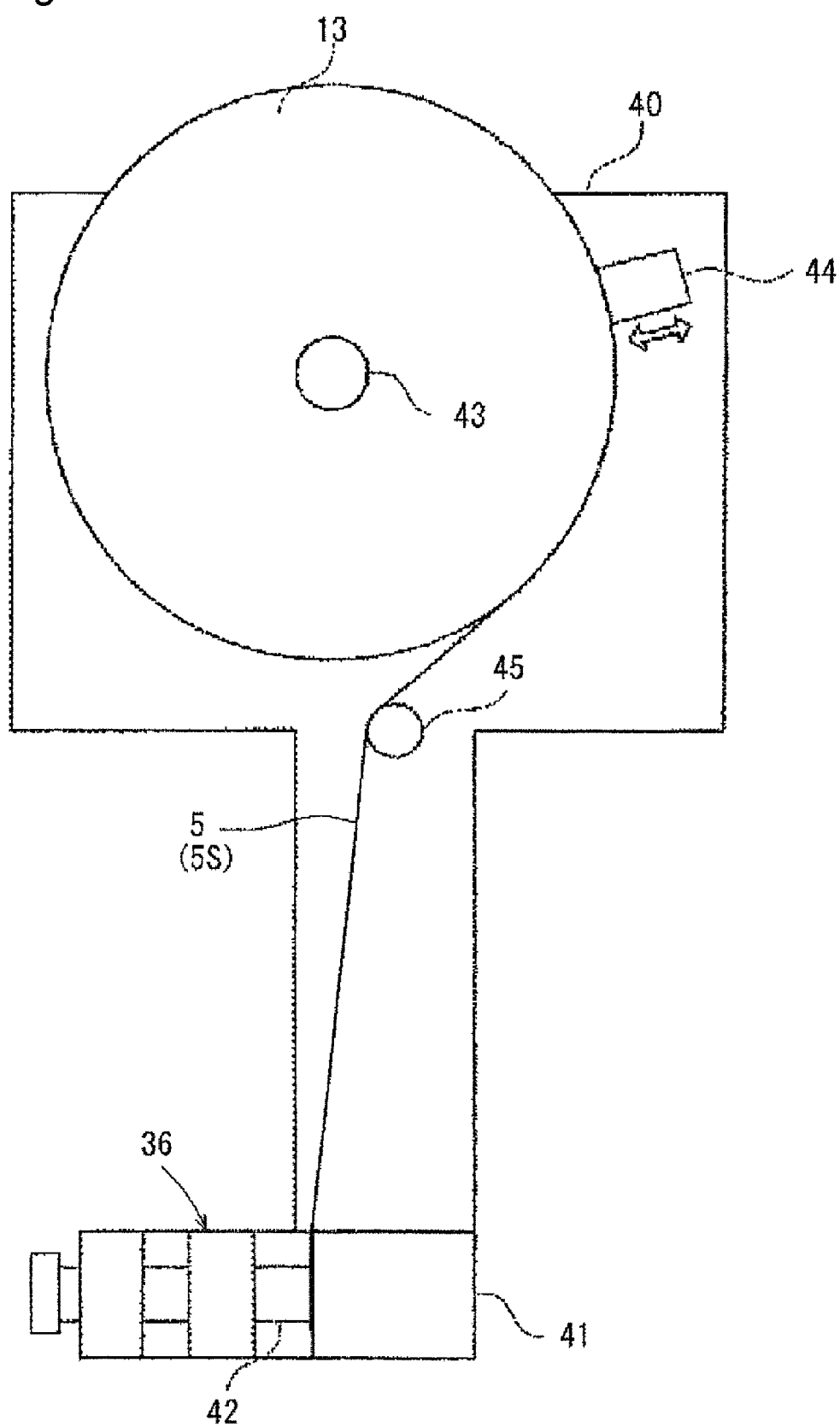
FIG. 7 is a front view of a reel support plate in the second embodiment.

As shown in FIG. 7, the reel support plate 40, which is generally T-shaped as a whole, includes: a pivotal support portion 43 for rotatably supporting the reel 13 upward thereof while the second holding part 36 is placed downward thereof; an engagement portion 44 which is put into engagement with or disengagement from the reel 13 by being put into pressure contact with or out of contact from an outer periphery of the reel 13; and a guide roller 45 for guiding the ACF tape 5 from the reel 13 to the second holding part 36. The leading end portion 5S of the ACF tape 5 rolled out from the reel 13 with its forward end held by the second holding part 36 is held in a tensile state by the engagement portion 44. As shown in FIGS. 5 and 6, the reel feeder 32 includes two movable holding units 46 in which a plurality (five in the shown example) of reel support plates 40 are arrayed in parallel and removably held, so that while the ACF tape 5 is being fed from the reel 13 held by one movable holding unit 46, the other movable holding unit 46 can be removed so as to allow replacement work for the reel support plates 40 to be carried out. Each movable holding unit 46 is movable and positionable by a moving device 47 so as to allow any arbitrary reel support plate 40 held thereon to be set to a position opposed to the tape splicer 31. The moving device 47 is so designed that the movable holding units 46 are removably fitted to movers 47b that are moved by a feed screw mechanism using a ball screw 47a. As shown in FIG. 6, further provided is a fixing unit 48 for fixing the reel support plates 40 positioned at positions facing the tape splicer 31. In addition, in this embodiment, the movable holding units 46, the moving device and the fixing unit 48 constitute a reel positioning device.

Next, with such a construction as shown above, ultrasonic fusion process will be described with reference mainly to FIG. 5 and FIGS. 8 to 10, where the ultrasonic fusion process refers to an operational process for, upon detection of the terminal end portion 5E of the first ACF tape 5a that is being fed from the in-use reel 13, replacing the ACF tape 5a with a new reel 13 and further splicing the terminal end portion 5E with the leading end portion 5S of the second ACF tape 5b rolled out from the new reel 13.

Figure 8:
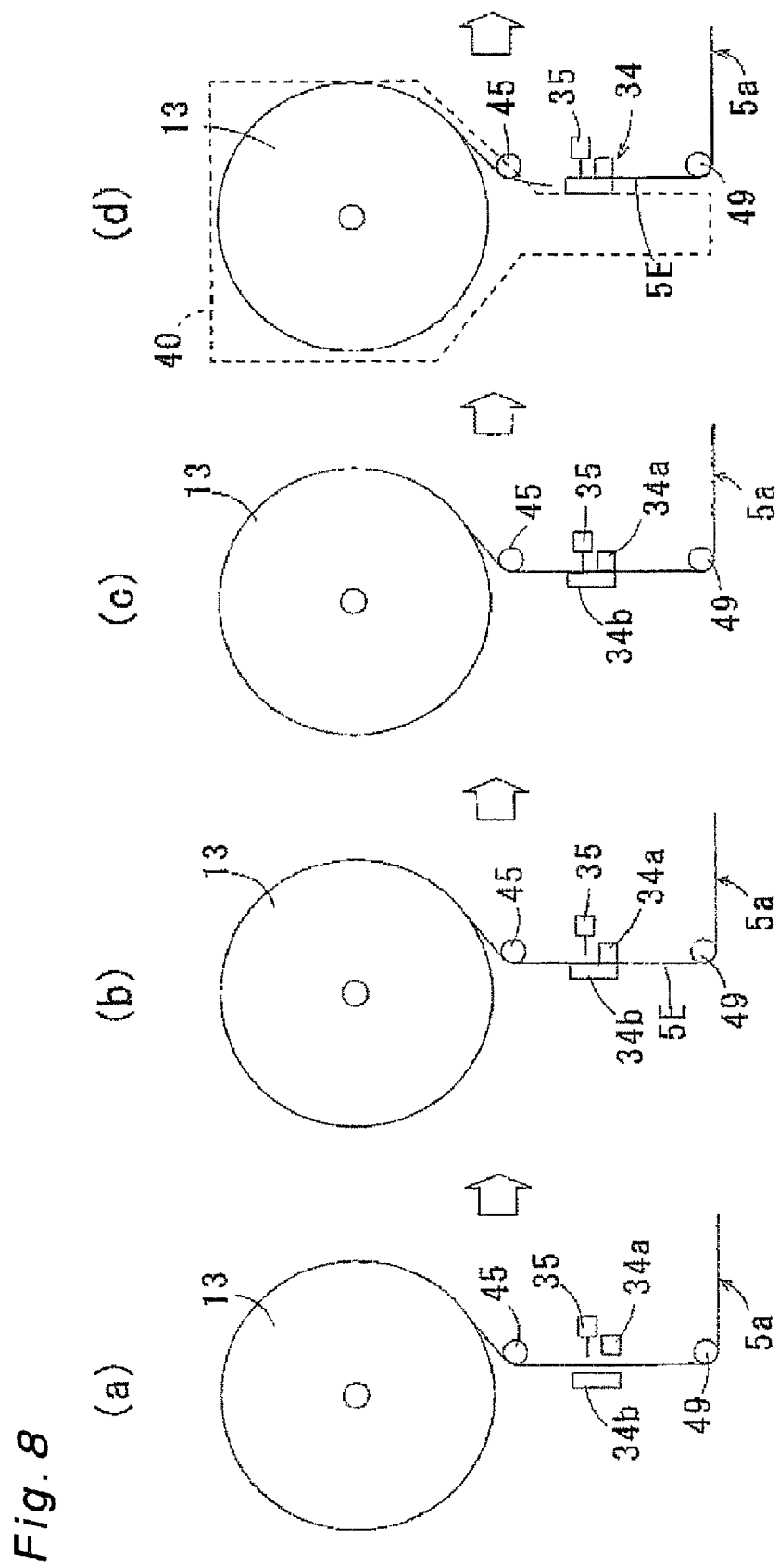
FIG. 8 is an explanatory view of tape splicing process in the second embodiment.

First, as shown in step (a) of FIG. 8, while the first ACF tape 5a is being fed from the in-use reel 13 and the ACF layer of the ACF tape 5a is being applied to the substrate one after another, a terminal end of the ACF tape 5a is detected. Upon the detection of the terminal end, the terminal end portion 5E is held by the holding members 34a, 34b of the first holding part 34 as shown in step (b) of FIG. 8, and an upper-part position of the terminal end portion 5E is cut by the first cutting part 35 as shown in step (c) of FIG. 8.

Figure 9:
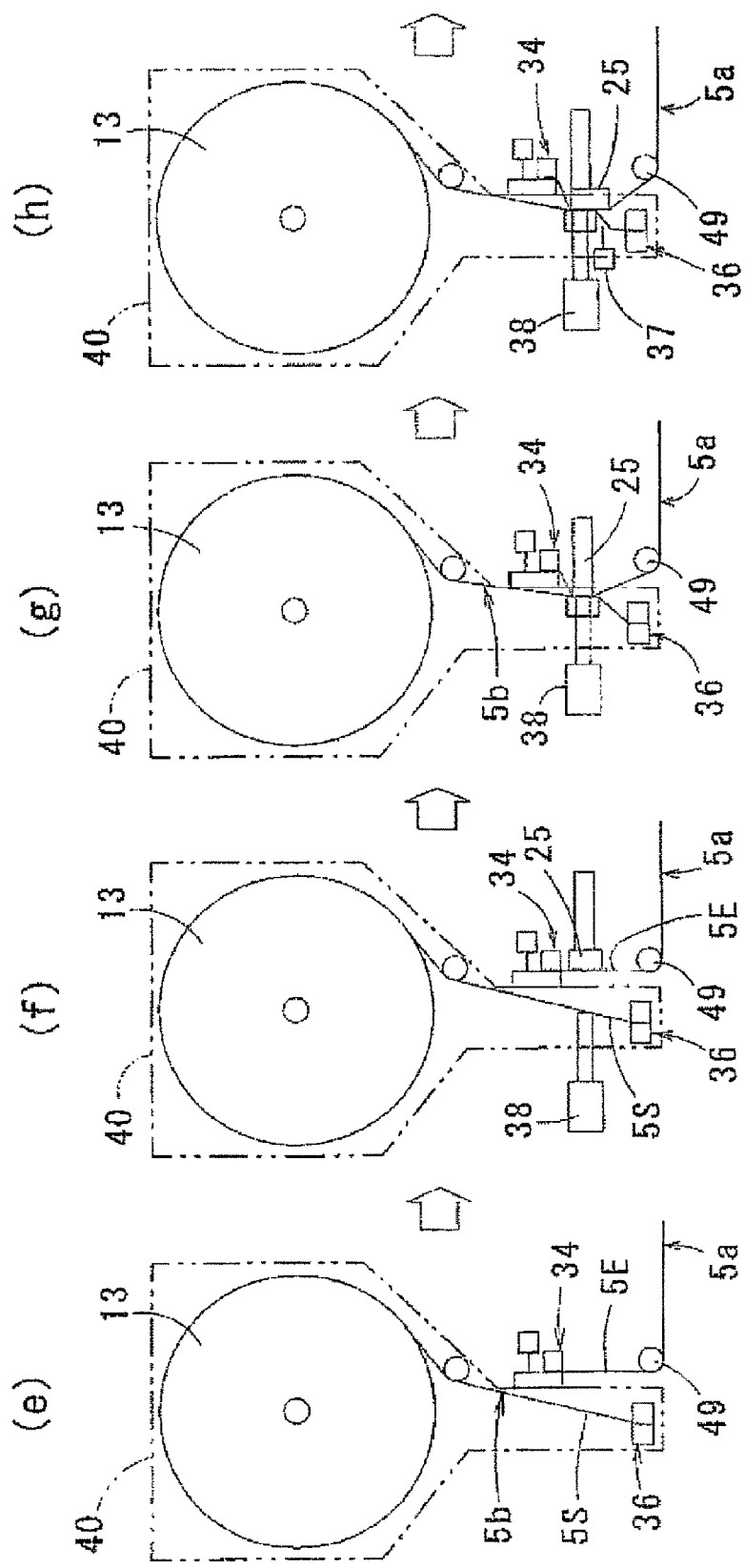
FIG. 9 is an explanatory view of the tape splicing process in the second embodiment.

Next, the movable holding units 46 is operated so that as shown in step (d) of FIG. 8 and step (e) of FIG. 9, a reel support plate 40 that has supported the in-use reel is withdrawn from the tape splicer 31, a next reel support plate 40 is positioned and fixed to a position facing the tape splicer 31. And the leading end portion 5S of the second ACF tape 5b rolled out from a new reel 13 is set so as to be superposed on the terminal end portion 5E of the first ACF tape 5a while being held by the second holding part 36. Thus, since the terminal end portion and the leading end portion of the tapes to be spliced together to be spliced together are so set as to be superposed on each other while being held by the first holding part 34 and the second holding part 36, a correct positioning can be achieved without causing any positioning shift. Also, by the constitution in which the movable holding units 46 is operated to allow the second ACF tape 5b to be fed from the next new reel 13, it becomes practicable to automatically implement the tape splicing.

Figure 11:
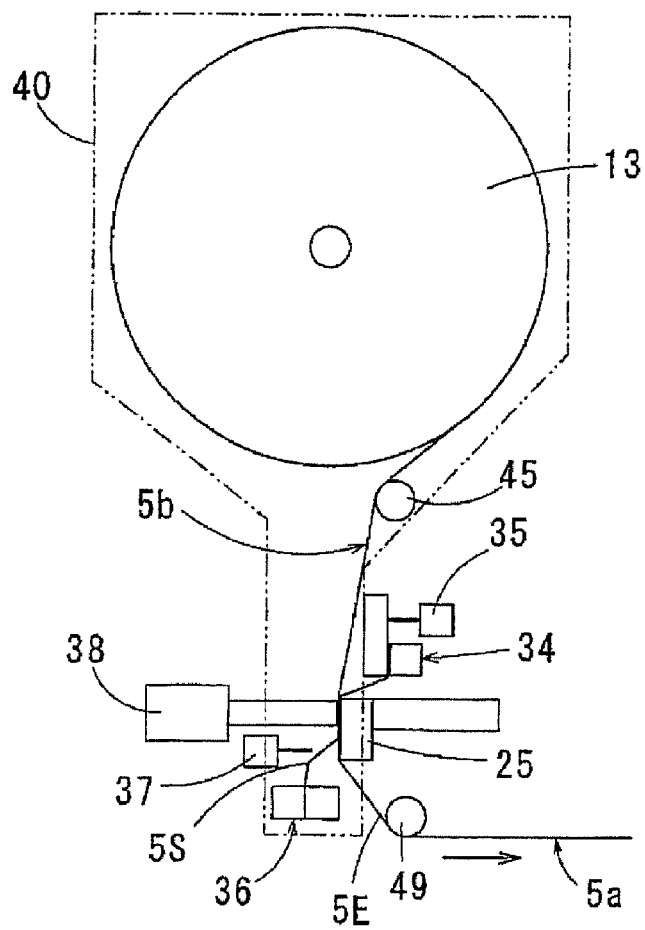
FIG. 11 is a front view showing a tape splicing state in the second embodiment.

Next, as shown in step (f) of FIG. 9, step (g) of FIG. 9, and FIG. 11, the leading end portion 5S of the second ACF tape 5b and the terminal end portion 5E of the first ACF tape 5a, which have been positioned so as to be superposed on each other, are ultrasonically spliced together by the ultrasonic splicer 38 while being supported by the stage 25 from the rear face side. In the ultrasonic splicer 38, ultrasonic vibrations 28 in the tape's thicknesswise direction are applied by using the ultrasonic tool 26 having the plurality of protruding portions 30 provided on the forward end surface. Therefore, ultrasonic vibration energy is concentratedly given to peripheries of the protruding portions 30 under the state that the plurality of protruding portions 30 are bitten into the two tapes in the tape's thicknesswise direction as shown in FIGS. 12A and 12B, thus the tapes being fusion-bonded together. Thus, the tape splicing can reliably be achieved with a necessary splicing strength even if the release tape of the ACF tape 5 is made from a hard-to-thermally-fuse tape material or even if the ACF tape 5 has a narrow tape width.

Figure 10:
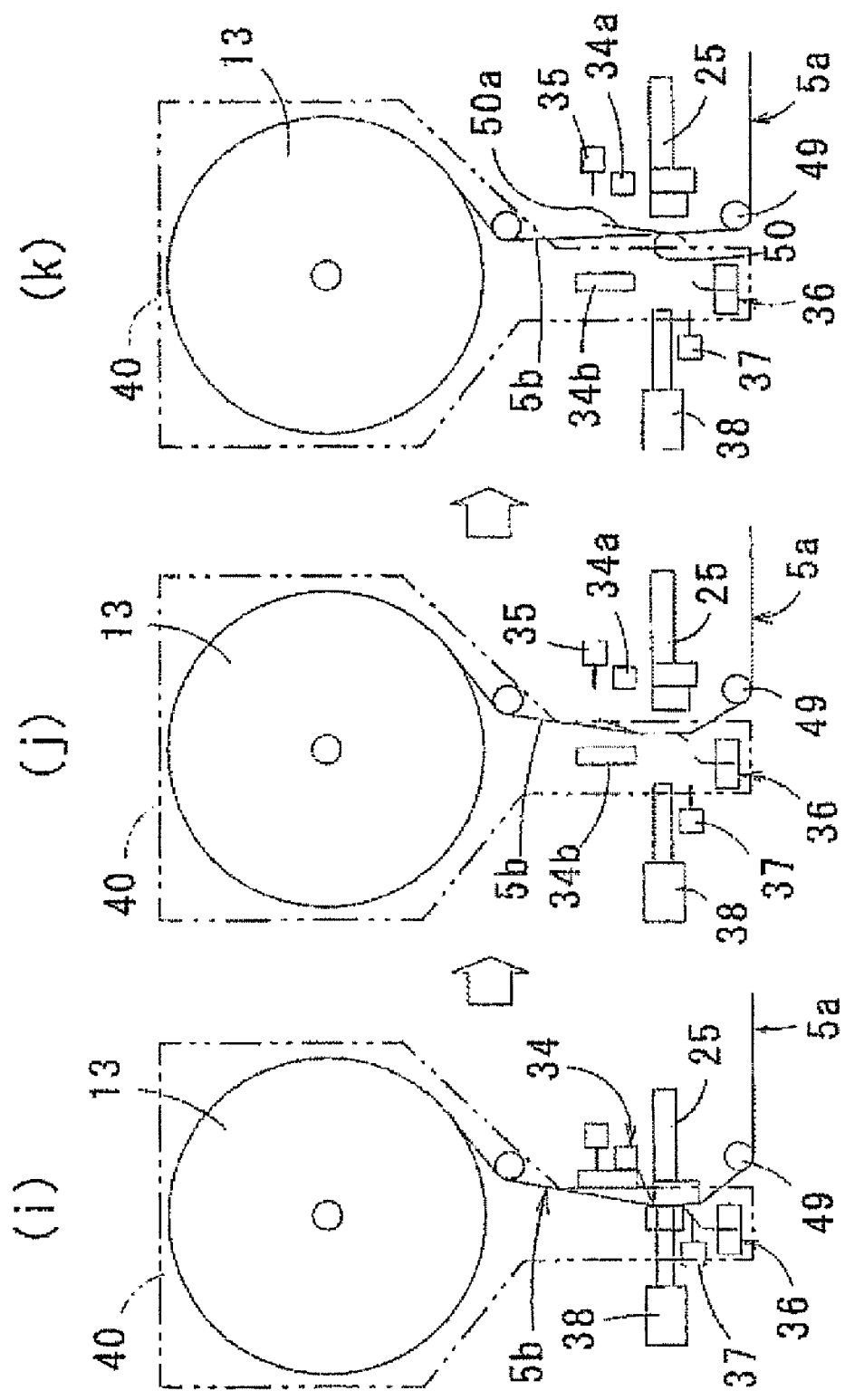
FIG. 10 is an explanatory view of the tape splicing process in the second embodiment.

Next, as shown in step (h) of FIG. 9 and step (i) of FIG. 10, a portion of the leading end portion 5S of the second ACF tape 5b on the second holding part 36 side from the splicing portion is cut by the second cutting part 37. Also, as shown in step (j) and step (k) of FIG. 10, the holding of terminal end portion 5E of the first ACF tape 5a by the holding members 34a, 34b in the first holding part 34 is released, and the ultrasonic splicer 38 and the stage 25 are withdrawn. In this way, the first ACF tape 5a and the second ACF tape 5b are automatically spliced together and continuously fed to the pressure bonding unit 6. In addition, when the splicing operation shown above is carried out, the tape feed extent is controlled so that a tape splicing portion 50 is completely passed through the pressure bonding place without staying at the pressure bonding place.

Besides, in the state of step (k) of FIG. 10, the ACF tape 5, as it is with the first ACF tape 5a and the second ACF tape 5b spliced together, may be fed to the pressure bonding unit 6. However, an end edge portion of the first ACF tape 5a that has been held by the first holding part 34 is protruded from the tape splicing portion as a whisker-like protruding portion (or ear-like protruding portion) 50a, which may obstruct the feeding operation of the ACF tape 5 in subsequent steps or cause some trouble.

Figure 13:
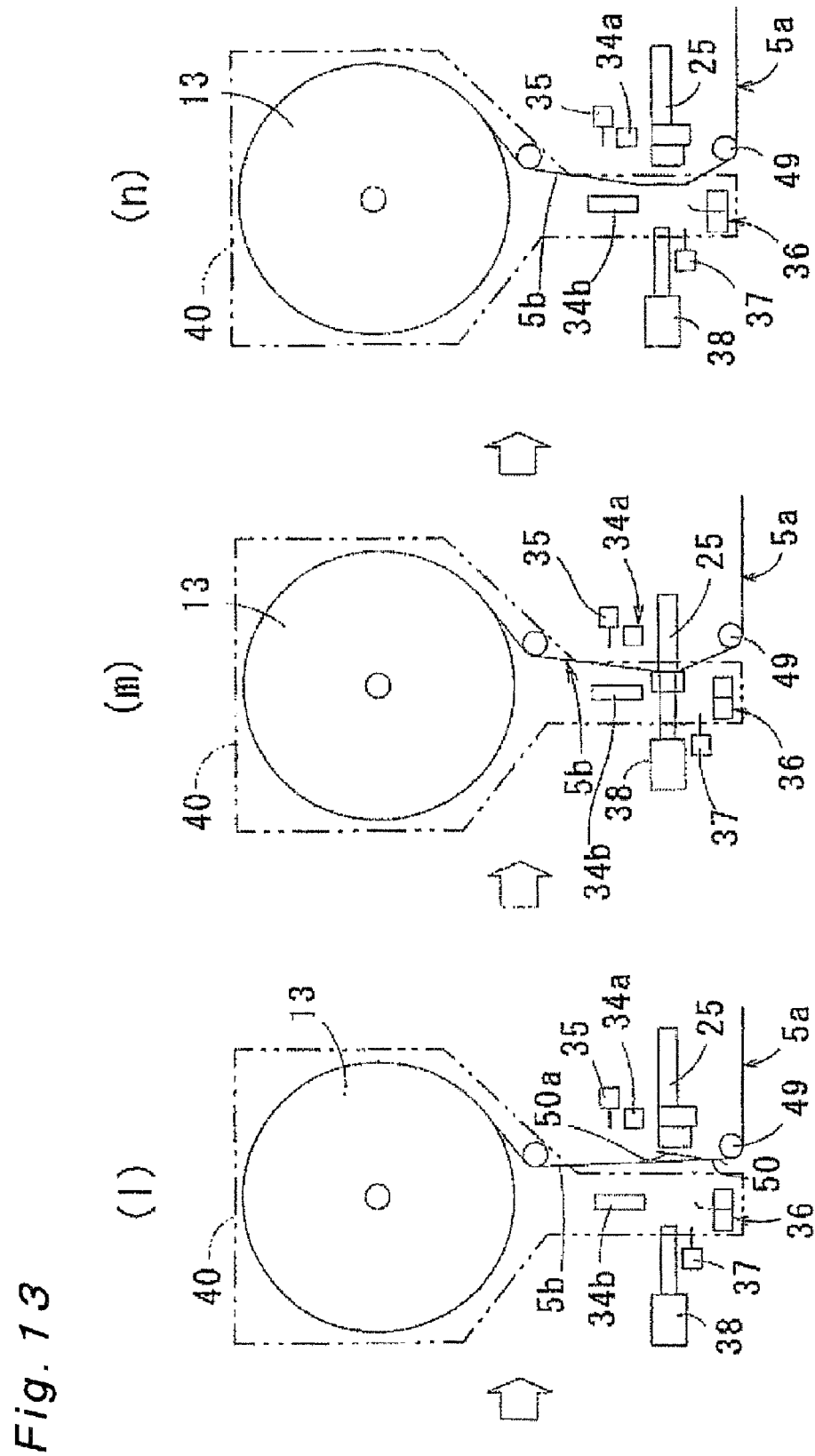
FIG. 13 is a process explanatory view of addable-tape end edge processing in the second embodiment.

Thus, it is preferable to add such end edge processing as shown in FIG. 13. Referring to FIG. 13, from step (k) of FIG. 10, the ACF tape 5 is moved so that the whisker-like protruding portion 50a of the terminal end portion 5E of the first ACF tape 5a is positioned between the ultrasonic splicer 38 and the stage 25 as shown in step (l) of FIG. 13. Then, as shown in step (m) of FIG. 13, the ultrasonic splicer 38 is brought into pressure contact with the second ACF tape 5b again, followed by an end edge fusion step that ultrasonic vibrations in the tape's thicknesswise direction are applied to perform fusion bonding of the whisker-like protruding portion 50a of the terminal end portion 5E of the first ACF tape 5a to the second ACF tape 5b. Thereafter, as shown in step (n) of FIG. 13, the ultrasonic splicer 38 and the stage 25 are withdrawn, and the first ACF tape 5a and the second ACF tape 5b spliced together are continuously fed to the pressure bonding unit 6.

As shown above, by fusion bonding of the whisker-like protruding portion 50a of the terminal end portion 5E of the first ACF tape 5a to the second ACF tape 5b, the possibility of obstruction by the whisker-like protruding portion 50a in the feed important of the ACF tape 5 after the bonding as well as the possibility of occurrence of some trouble can be eliminated. In addition, the end edge processing may similarly be applied also to the leading end portion 5S of the second ACF tape 5b. However, since the cutting place to be cut after the splicing of the leading end portion 5S can be set at a proximity to the tape splicing portion 50, the end edge portion becomes a short one on the outer surface side that makes no contact with rollers or the like mainly constituting the feeding path of the ACF tape 5, the end edge processing does not necessarily need to be done.

Figure 14:
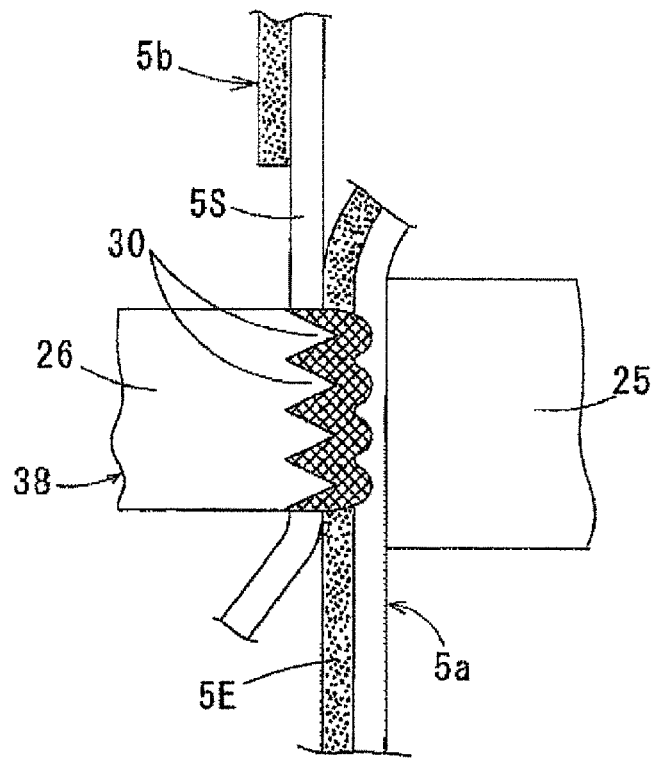
FIG. 14 is a detailed sectional view of a splicing state in an ACF applying apparatus according to another embodiment of the invention.

The foregoing embodiments have been described on examples in which the terminal end portion 5E of the first ACF tape 5a and the leading end portion 5S of the second ACF tape 5b to be spliced together are formed each into the release tape alone with the ACF layer removed from the ACF tape 5. However, in this invention, since ultrasonic vibrations 28 in the tape's thicknesswise direction are applied for splicing of the two tapes by using the ultrasonic tool 26 having the plurality of protruding portions 30 provided on the forward end surface, the splicing can reliably be achieved with a necessary splicing strength even in a state that the terminal end portion 5E of the in-use first ACF tape 5a has the ACF layer as shown in FIG. 14. In this case, a special processing for the terminal end portion 5E of the ACF tape 5 to be wound on the reel 13 is no longer needed, or the pressure bonding process or the like for removing the ACF layer at the terminal end portion becomes unnecessary, so that cost reduction of the ACF tape 5 or working-process simplification can be achieved. Moreover, similar splicing can be achieved even with adhesive tape having a terminal end mark tape at the terminal end portion.

Figure 15:
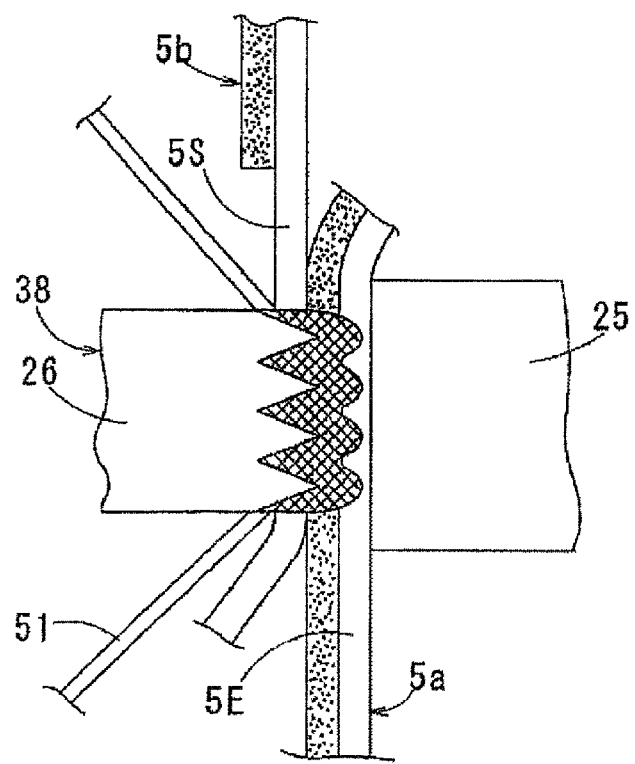
FIG. 15 is a detailed sectional view of a splicing state in an ACF applying apparatus according to still another embodiment of the invention.
Figure 16A:
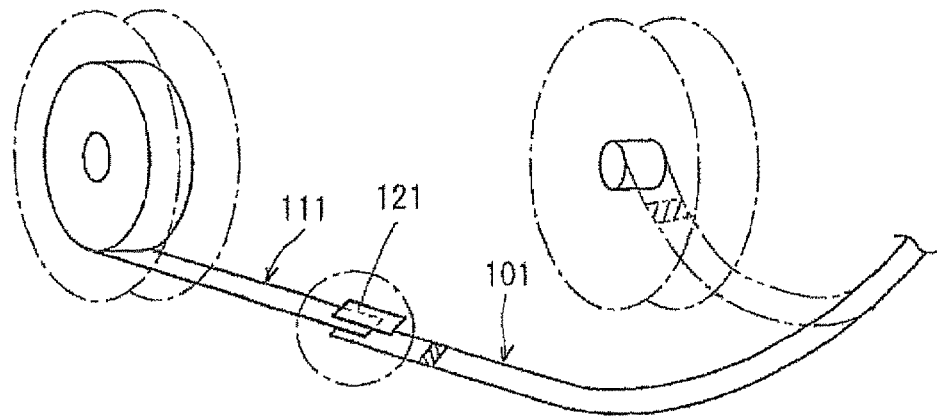
FIG. 16A is a perspective view showing an example of the conventional adhesive tape splicing mode.
Figure 16B:
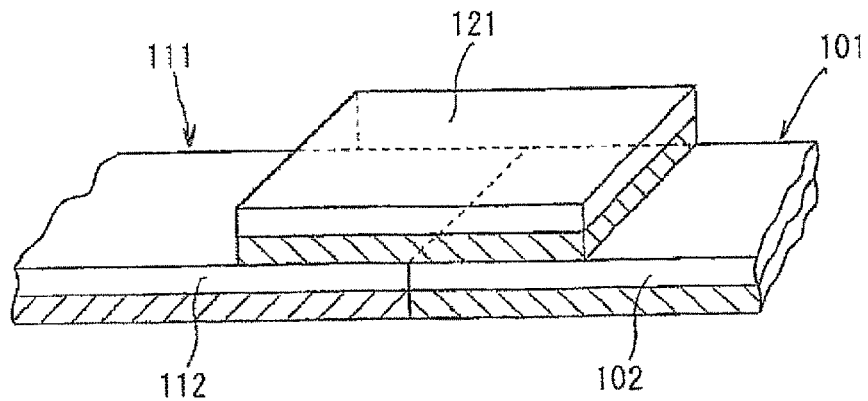
FIG. 16B is an enlarged perspective view of a main part of FIG. 16A.

Also, in cases where melts of the ACF tape 5 are deposited on the forward end surface of the ultrasonic tool 26 with the result of gradually deteriorated transmission efficiency of ultrasonic vibration energy, a 80 to 100 μm thick protective tape 51 made from polytetrafluoroethylene (PTFE) as an example may be provided interveniently as shown in FIG. 15.

Also, the foregoing embodiments have been described only on examples in which the ACF tape having the ACF (anisotropic conductive film) layer provided on one side of release tape is used as the adhesive tape. However, without being limited to component mounting using ACF tape, the invention may be applied similarly to cases in which components are mounted by applying a nonconductive film onto the substrate. Besides, the invention may be applied also to the splicing of protective tape in adhesive tape applying apparatuses or pressure bonding devices in which the protective tape is interposed and pressure-bonded between pressure bonding head and adhesive tape or between pressure bonding head and components so as to prevent applying of adhesive material to the pressure bonding head.

Figure 17:
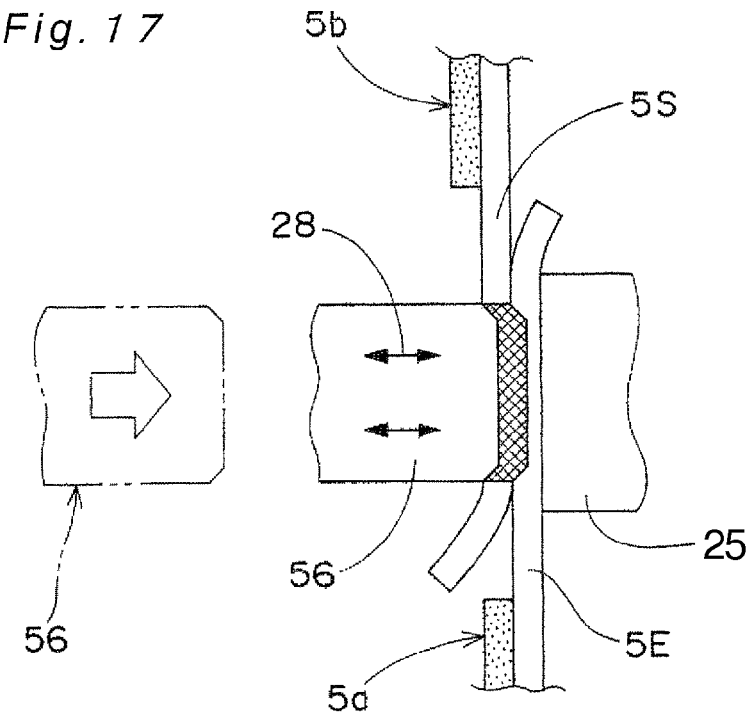
FIG. 17 is a schematic view showing a tape splicing state by an ultrasonic tool according to another embodiment of the invention.

Moreover, instead of using the ultrasonic tool 26 having the plurality of protruding portions 30 provided on the forward end surface, an ultrasonic tool 56 having no protruding portions on the forward end surface, which is formed as a flat surface, may be used to apply the ultrasonic vibrations 28 in the tape's thicknesswise direction for splicing of the two tapes, as shown in FIG. 17.

It is to be noted that, by properly combining the arbitrary embodiments of the aforementioned various embodiments, the effects possessed by them can be produced.

According to the adhesive tape applying apparatus and the tape splicing method of the invention, in a state that a terminal end portion and a leading end portion of two tapes to be spliced together are set in superposition on a stage, ultrasonic vibrations are applied in the tape's thicknesswise direction by an ultrasonic tool. Thereby, the two tapes are fusion-bonded by ultrasonic vibration energy. Therefore, the tape splicing can reliably be achieved in a necessary splicing strength state even if the tape is made from a hard-to-thermally-fuse tape material or even if the tape has a narrow tape width. Thus, the invention apparatus and method can preferably be applied to component mounting apparatuses for mounting various types of components with adhesive tape applied to the substrate.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Application No. 2007-260310 filed on Oct. 3, 2007, including specification, claims, and drawings are incorporated herein by reference in its entirety.

The invention claimed is:

1. An adhesive tape applying apparatus comprising:
a tape feeding unit for feeding a tape member from a reel, the tape member having adhesive tape applied on one side of a release tape, the reel being replaceably provided in the tape feeding unit and having the tape member wound thereon;
a pressure bonding device for pressing the tape member fed from the tape feeding unit to a substrate so that the adhesive tape separated from the release tape is applied onto the substrate; and
a tape splicer for splicing together a terminal end portion of an in-use first tape member and a leading end portion of a second tape member rolled out from an added reel, wherein the tape splicer comprises:
a stage on which the terminal end portion of the first tape member and the leading end portion of the second tape member are placed so as to be superimposed on each other;
an ultrasonic tool having a contact surface to be put into contact with the leading . end portion or terminal end portion of the superposed tape members;
an ultrasonic vibration generator for applying ultrasonic vibrations in a tape's thicknesswise direction to the ultrasonic tool;
a pressing device for pressing the ultrasonic tool toward the stage:
a first holding part for holding the terminal end portion of the first tape member;
a second holding part for holding the leading end portion of the second tape member; and
a control unit for executing:
an ultrasonic fusion-bonding process in which. in a state that the terminal end portion of the first tape member held by the first holding part and the leading end portion of the second tape member held by the second holding part are placed so as to be superposed on the stave, the pressing device is controlled so as to make the contact surface of the ultrasonic tool pressed aeainst the superposed tape members, while the ultrasonic vibration generator is controlled so as to apply ultrasonic vibrations in a tape's thicknesswise direction to the ultrasonic tool so that the terminal end portion of the first tape member and the leading end portion of the second tape member are spliced together by ultrasonic fuision bonding; and an end edge fusion-bonding process in which, after execution of the ultrasonic fusion-bonding process, the holding of the terminal end portion of the first tape member by the first holding part is released and the tape member is moved so that at least the terminal end portion of the first tape member is positioned between the ultrasonic tool and the stage, and in which once again the pressing device is controlled so as to make the contact surface of the ultrasonic tool press against the end edge portion of the terminal end portion of the first tape member while the ultrasonic vibration generator is controlled so as to apply ultrasonic vibrations in the tape's thicknesswise direction to the ultrasonic tool so that the terminal end portion of the first tape member is spliced with the leading end portion of the second tape member by ultrasonic fusion bonding.

2. The adhesive tape applying apparatus as defined in claim 1, wherein the ultrasonic tool has a plurality of protruding portions provided on the contact surface, and the protruding portions have a height h satisfying that h >t, relative to a thickness t of the release tape.

3. The adhesive tape applying apparatus as defined in claim 2, wherein the protruding portions of the ultrasonic tool each have a chevron-like cross-sectional shape having a top angle of 60° to 120°.

4. The adhesive tape applying apparatus as defined in claim 2, wherein the first holding part holds holding the terminal end portion of the first tape member in a tensile state, the second holding part holds the leading end portion of the second tape member in a tensile state, and while the terminal end portion of the first tape member is held by the first holding part in a tensile state and the leading end portion of the second tape member is held by the second holding part in a tensile state, the terminal end portion of the first tape member and the leading end portion of the second tape member are placed so as to be superposed on the stage.

5. The adhesive tape applying apparatus as defined in claim 4, further comprising:

a plurality of reel support plates each of which rotatably holds a reel having a tape member wound thereon and has a second holding part; and a reel positioning device which removably holds a plurality of reel support plates placed in parallel and which performs positioning of one reel support plate held by the reel positioning device to a position facing the tape splicer.

6. A tape splicing method for splicing a leading end portion of an added second tape member with a terminal end portion of an in-use first tape member in an adhesive tape applying apparatus in which a tape member with an adhesive tape applied on one side of a release tape is fed from a reel having the tape member wound thereon, the fed tape member being then pressed against a substrate so that the adhesive tape separated from the release tape is applied to the substrate, the method comprising:

placing the terminal end portion of the first tape member and the leading end portion of the second tape member in superposition on each other in a state that the terminal end portion of the first tape member is held while the leading end portion of the second tape member is held; and pressing the contact surface of an ultrasonic tool against a superposition area of the end portions while applying ultrasonic vibrations in the tape's thicknesswise direction to the ultrasonic tool so that the terminal end portion of the first tape member and the leading end portion of the second tape member are ultrasonically fusion-bonded together;

releasing the holding of the terminal end portion of the first tape member: and thereafter pressing an end edge portion the terminal end portion of the first tape member and the leadinc end portion of the second tape member by the contact surface of the ultrasonic tool while applying, ultrasonic vibrations in the tape's thicknesswise direction to the ultrasonic tool so that the end edge portion of the terminal end portion of the first tape member is ultrasonically fusion-bonded with the leading end portion oldie second tape member.

7. The tape splicing method as defined in claim 6, wherein the ultrasonic tool used for ultrasonic fusion bonding is an ultrasonic tool in which a plurality of protruding portions are formed in its contact surface and each having a height larger than a thickness of the release tape.

8. The tape splicing method as defined in claim 7, wherein in placing the tape members in superposition on each other, the terminal end portion of the first tape member is held in a tensile state while the leading end portion of the second tape member is held in a tensile state, in which state the terminal end portion of the first tape member and the leading end portion of the second tape member are placed on the stage in superposition.

9. The tape splicing method as defined in claim 8, wherein upon detection of the terminal end portion of the first tape member, the terminal end portion is held while the reel having the second tape member wound thereon is positioned to a position facing the stage, and the terminal end portion of the first tape member and the leading end portion of the second tape member are placed on the stage in superposition.

\* \* \* \* \*